United States Patent [19]

Ohhashi

[11] Patent Number: 4,498,178
[45] Date of Patent: Feb. 5, 1985

[54] DATA ERROR CORRECTION CIRCUIT

[75] Inventor: Masahide Ohhashi, Sagamihara, Japan

[73] Assignee: Tokyo Shibaura Denki Kabushiki Kaisha, Japan

[21] Appl. No.: 467,297

[22] Filed: Feb. 17, 1983

[30] Foreign Application Priority Data

Feb. 26, 1982 [JP] Japan .................................. 57-29981

[51] Int. Cl.³ .............................................. G06F 11/10
[52] U.S. Cl. ........................................ 371/37; 371/38
[58] Field of Search ......................... 371/37, 38, 39, 40

[56] References Cited

U.S. PATENT DOCUMENTS

| 3,311,879 | 3/1967 | Daher ..................................... 371/37 |
| 3,373,404 | 3/1968 | Webb ..................................... 371/37 |
| 3,872,430 | 3/1975 | Boudreau et al. ..................... 371/37 |
| 4,216,540 | 8/1980 | McSpadden ........................... 371/37 |

OTHER PUBLICATIONS

Maholick et al., A Universal Cyclic Division Circuit, Fall Joint Computer Conference, 1971, pp. 1-8.

Peterson, "Error-Correcting Codes", pp. 194-195 (1961 John Wiley & Sons, Inc.).

Maniar et al., "Fire Codes on Custom Chip Clean Up Hard Disk Data", Electronics, May 5, 1981, pp. 122-125.

Primary Examiner—Charles E. Atkinson
Attorney, Agent, or Firm—Finnegan, Henderson, Farabow, Garrett & Dunner

[57] ABSTRACT

A data error correction circuit is provided, which receives input data having check bit data added thereto, the input data being divided by a generator polynomial G(x) in terms of the modulo 2 and multiplied by a correction polynomial M(x) in terms of modulo 2. An error in the input data is detected and corrected in accordance with contents of a syndrome obtained by these operations. The data error correction circuit includes a latch circuit and a presettable data input circuit. Data from the presettable data input circuit is divided by the generator polynomial G(x) in terms of the modulo 2, and remainder bit data obtained thereby is stored in the latch circuit as the correction polynomial M(x).

6 Claims, 4 Drawing Figures

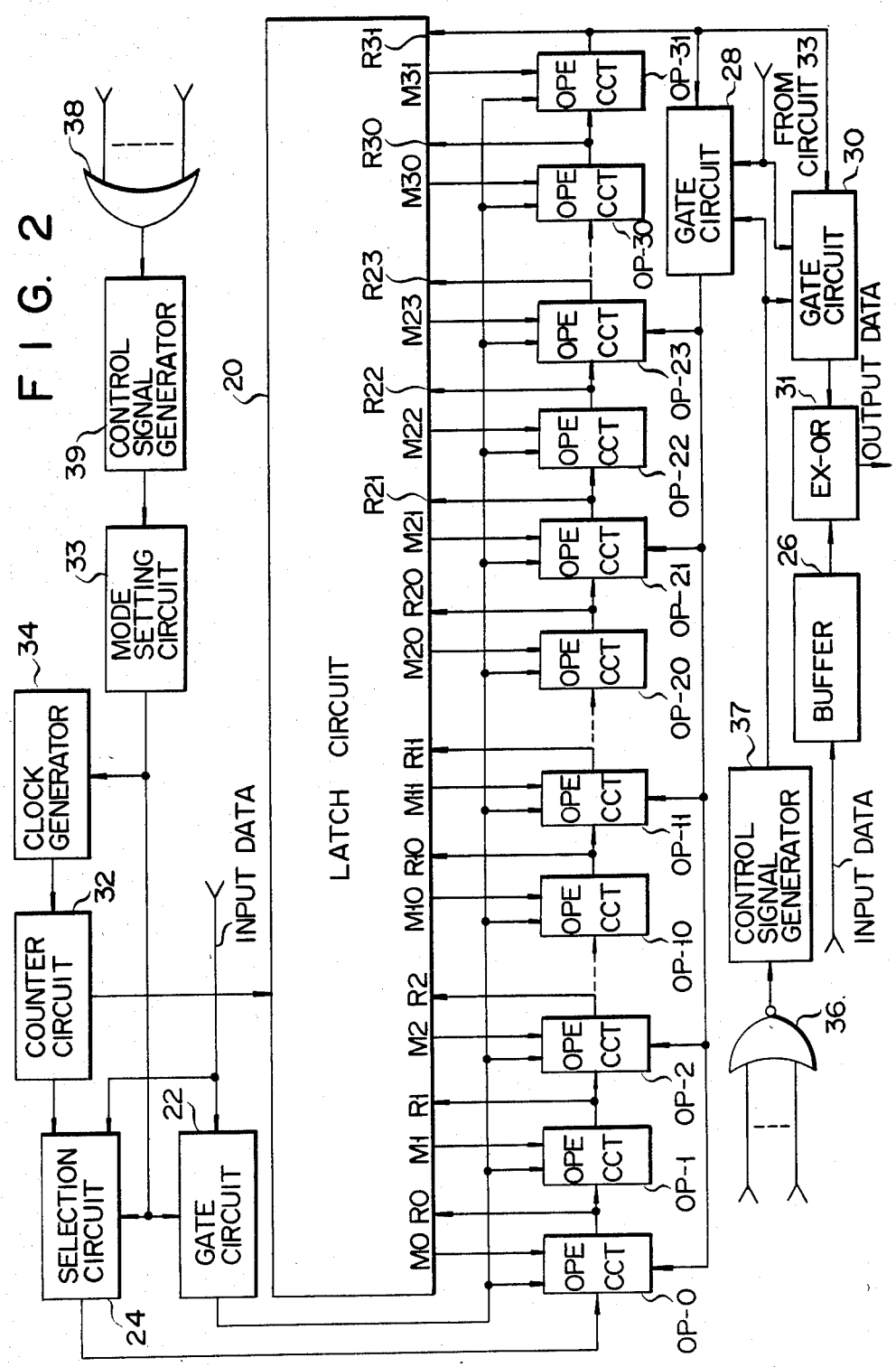
F I G. 2

DATA ERROR CORRECTION CIRCUIT

BACKGROUND OF THE INVENTION

The present invention relates to a data error correction circuit for detecting and correcting data errors occurring during data transfer.

Recently, with the increase of the memory density of a magnetic disk memory, the probability of data errors occurring during data transfer has also increased. For example, a burst error or a series of erroneous bits caused by, for example, defects in storage media or external electric noise in the data to be transferred can seriously affect a data processing system. Conventionally, in order to solve these problems, various data error correction circuits have been provided for detecting and correcting data errors. For example, a data error correction circuit utilizing Fire codes is extremely effective in correcting a burst error. When correcting erroneous data using the Fire codes, the maximum number of bits and the number of correctable bits are determined according to a generator polynomial selected from a plurality of generator polynomials for generating fire codes in order to calculate check bits. When the number of check bits is 32, and the generator polynomial $G(x)$ is $(x^{21}+1)(x^{11}+x^2+1)$, the maximum number of transferrable bits (the length of a Fire code) and the number of correctable bits are set to 42,987 and 11, respectively.

Usually, for detecting and correcting an error in data to be transferred, the data is divided into units each of which corresponds to a predetermined number of bits, and a check bit is generated according to each unit of serial data. Each check bit is obtained in the form of a remainder obtained by dividing each unit serial data by the generator polynomial $G(x)$ in terms of the modulo 2. Each check bit or remainder thus obtained is added to the end of the corresponding serial data and stored in a memory such as a magnetic disk memory. When transferring data from this memory, the unit serial data is read out together with the check bit, and a sequence data including the unit serial data and the check bit are divided by the generator polynomial $G(x)$. The remainder of the division operation represents a bit pattern known as a syndrome. If the unit serial data read out from the memory does not include an error, the syndrome becomes 0. Thus, when the syndrome is not 0, it indicates occurrence of an error. At this time, the position and the content of the erroneous bit in the unit serial data can be obtained by checking the bit position at which "1" is generated. Conventionally, a data error correction circuit is provided wherein a burst error can be corrected by calculating an exclusive OR product of a sequence of data including a burst error, and an error pattern obtained by cyclically shifting the syndrome. However, this data error correction circuit presents a problem in actual detection and the correction of an error occurring in data to be transferred. That is, even if the maximum number of bits of transferrable data is set to 42,987, the data to be actually transferred is of, for example, 128, 256, 512 or 1024 bytes. Therefore, unnecessary data may be generated. For example, data to be transferred of 1024 bytes or 8192 bits corresponds to about 1/5 of the maximum transferrable number of bits (42,987). Thus, upon the error detection and correction operation, data of about 35,000 bits may be transferred with no purpose, thus reducing the efficiency of the error correction circuit.

In order to overcome the above drawbacks, a method such as the Chinese remainder theorem method is provided for correcting errors at a high speed. However, this method requires a more complicated circuit configuration. Another data error correction circuit is also provided which shortens the length of data to be transferred or processed. However, if the length of the shortened data is set, it cannot be changed. In order to change the length of data, the configuration of the data error correction circuit itself must be altered.

SUMMARY OF THE INVENTION

It is an object of the present invention to provide a data error correction circuit wherein errors in shortened data of different lengths can be easily corrected at a high speed.

According to one aspect of the present invention, a data error correction circuit is provided, comprising present data input means, data selecting means for selecting one of input data with check bit data added thereto and preset data from said preset data input means, latch means for latching a correction polynomial $M(x)$, and error correction means for dividing, in a first operating mode, said preset data by a generator polynomial $G(x)$ in terms of the modulo 2 and storing remainder bit data obtained in said latch circuit as a correction polynomial $M(x)$, and for multiplying, in a second operating mode, the input data with said check bit data by said correction polynomial $M(x)$ and dividing the input data by said generator polynomial $G(x)$ to obtain a syndrome in terms of the modulo 2, thereby detecting and correcting an error in the input data in accordance with the content of the syndrome.

According to the present invention, the preset data input means supplies input data having various data lengths to the error correction means, and the input data is divided by the generator polynomial $G(x)$ to obtain the correction polynomial $M(x)$. Therefore, even if the length of data to be transferred is varied, a correction polynomial $M(x)$ corresponding to data of a changed data length can be easily obtained.

BRIEF DESCRIPTION OF THE DRAWINGS

FIG. 2 is a block diagram of the data error correction circuit shown in FIG. 1.

DETAILED DESCRIPTION OF THE PREFERRED EMBODIMENTS

Figure 1:
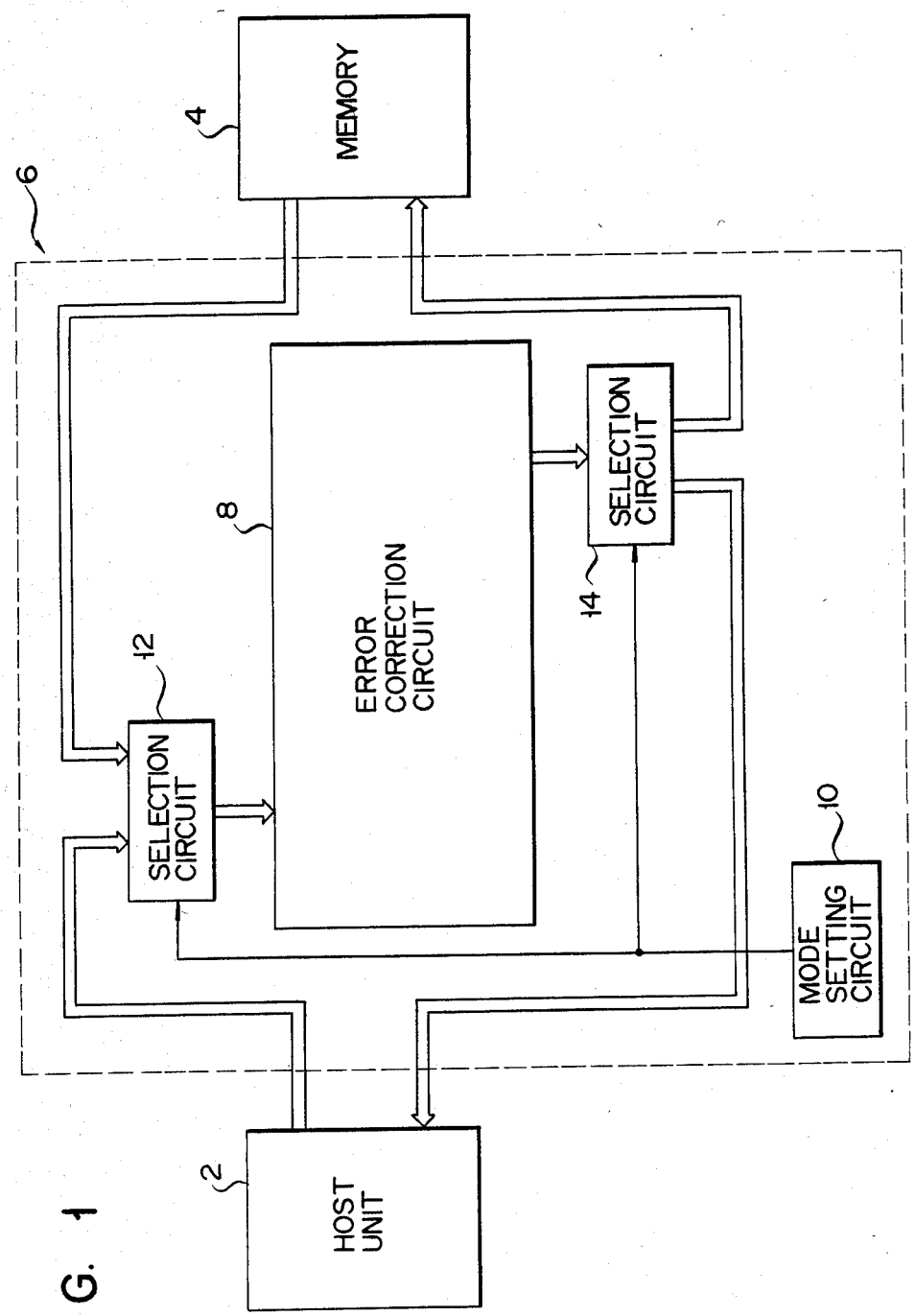
FIG. 1 is a block diagram of a data processing system including a data error correction circuit according to an embodiment of the present invention.

FIG. 1 shows a data transfer control system for a computer including a host processor unit 2 such as a central processing unit, a memory 4 such as a magnetic disk memory, and a data transfer control circuit 6 connected between the host processor 2 and the memory 4 and incorporating an error correction circuit 8 according to an embodiment of the present invention. The data transfer control circuit 6 also include a mode setting circuit 10 for generating first and second transfer mode setting signals; a data selection circuit 12 which is set to a first selection mode in response to the first transfer mode setting signal to transfer data from the host processor 2 to the error correction circuit 8, and is set to the second selection mode in response to the second transfer mode setting signal to transfer data from the memory 4 to the error correction circuit 8; and a data selection circuit 14 which is set to the first selection mode in response to the first transfer mode setting signal to transfer data from the error correction circuit 8 to the memory 4, and is set to the second selection mode in response to the second transfer mode setting signal to transfer data from the error correction circuit 8 to the host processor 2. In the data processing system shown in FIG. 1, when data is transferred from the host processor 2 to the memory 4, the first transfer mode setting signal is generated by the mode setting circuit 10 to set the data selection circuits 12 and 14 to the first selection mode. Transfer data check bits are produced by the error correction circuit 8, and transfer data with the respective check bits added thereto is stored in the memory 4. When data is transferred from the memory 4 to the host processor 2, the second transfer mode setting signal is generated by the mode setting circuit 10 to set the data selection circuits 12 and 14 to the second selection mode. The data selection circuits 12 and 14 serve to detect any error in data read out from the memory 4. If an error is detected, it is corrected, and the corrected data is transferred to the host processor 2.

FIG. 2 shows a block diagram of the error correction circuit 8 shown in FIG. 1. The error correction circuit 8 includes a latch circuit 20 having latch input terminals R0 to R31 and latch output terminals M0 to M31, operation circuits OP-0 to OP-31 connected in series, a gate circuit 22 whose output terminal is connected in common to the first input terminal of each of the operation circuits OP-0 to OP-31, and an input selection circuit 24 whose output terminal is connected to a data input terminal of the operation circuit OP-0. Latch output terminals M0 to M31 of the latch circuit 20 are connected to the second input terminals of the operation circuits OP-0 to OP-31, respectively. Latch input terminals R0 to R31 of the latch circuit 20 are connected to the output terminals of the operation circuits OP-0 to OP-31, respectively. The error correction circuit 8 further includes a buffer 26 for storing input data, gate circuits 28 and 30 each of which is connected to the output terminal of the operation circuit OP-31, an exclusive-OR gate 31 connected to the buffer 26 and to the gate circuit 30, a presettable down-counter 32 for counting clock pulses from a clock generator 34 and connected to the input selection circuit 24, an operation mode setting circuit 33 for selectively setting the operation mode of the error correction circuit 8, a NOR gate 36 whose input terminal is connected to each of the output terminals of the operation circuits OP-0 to OP-20, a control signal generator 37 whose input terminal is connected to the NOR gate 36 and whose output terminal is connected to the gate circuits 28 and 30, an OR gate 38 connected to each of the output terminals of the operation circuits OP-0 to OP-31, and a control signal generator 39 for supplying control signals to the operation mode setting circuit 33 in response to the output signal from the OR gate 38. The presettable down-counter circuit 32 generates a signal of "1" level when its count value is the same as the preset value, a signal of "0" level when its count value is lower than the preset value, and a latch control signal to the latch circuit 20 when its count value reaches 0. The presettable down-counter circuit 32 may include a presettable down-counter (not shown) and a flip-flop (not shown). The flip-flop is set to generate a signal of "1" level in response to a preset signal supplied for presetting the down-counter, and is reset in response to a counting clock pulse generated after the preset signal.

Figure 3:
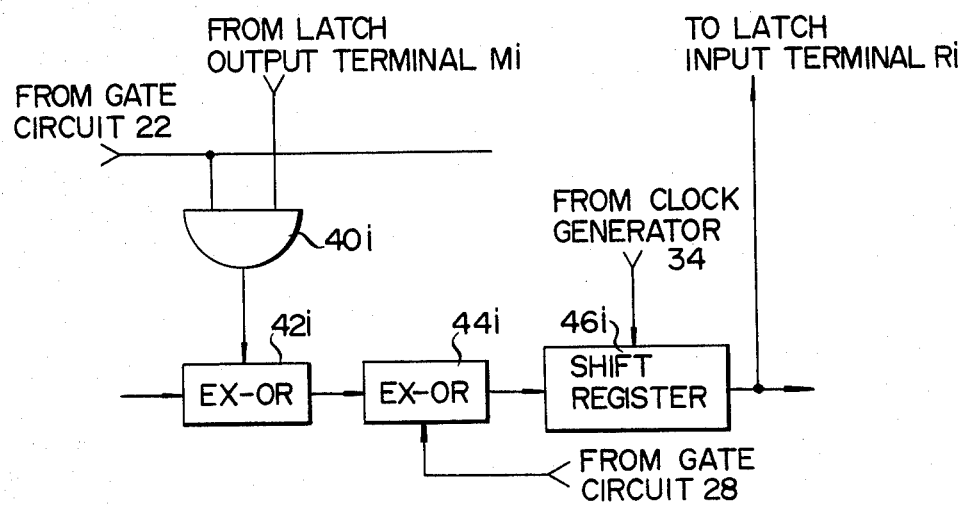
FIGS. 3 and 4 are circuit diagrams of operation circuits of different types used in the data error correction circuit shown in FIG. 2.
Figure 4:
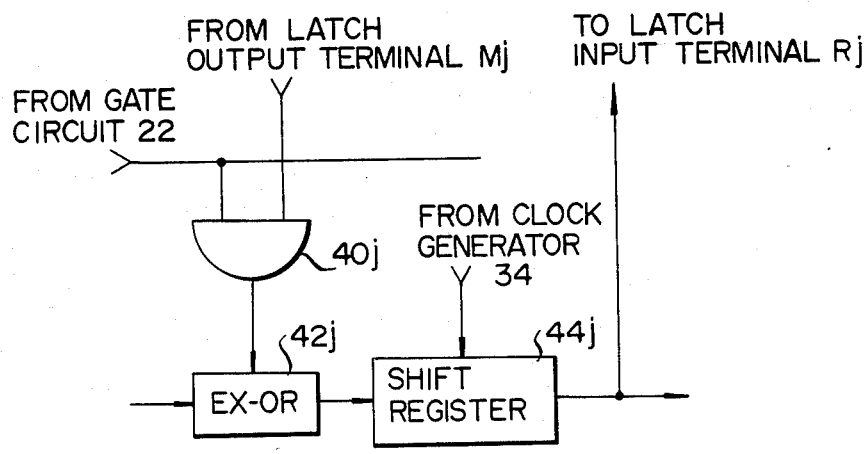

According to the above embodiment, the output terminal of the gate circuit 28 is connected to the third input terminal of each of the operation circuits OP-0, OP-2, OP-11, OP-21 and OP-23 so as to divide the input data by a generator polynomial $G(x)=(x^{21}+1)(x^{11}+x^2+1)=x^{32}+x^{23}+x^{21}+x^{11}+x^2+x^0$ in terms of the modulo 2. The configuration of each of the operation circuits OP-0, OP-2, OP-11, OP-21 and OP-23 are shown in FIG. 3. The configuration of each of the other operation circuits are shown in FIG. 4. In particular, each of the operation circuits OP-0, OP-2, OP-11, OP-21 and OP-23 includes an AND gate $40i$ connected to the output terminal of the gate circuit 22 and to a latch output terminal $Mi$ of the latch circuit 20; an exclusive-OR gate $42i$ for calculating the exclusive OR value of the output bits from the AND gate $40i$ and the input bits supplied to its data input terminal; an exclusive-OR gate $44i$ for calculating the exclusive OR value of the output bits from the exclusive-OR circuit $42i$ and the output bits from the gate circuit 28; and a shift register $46i$ for storing the output bits from the exclusive-OR circuit $44i$ in response to a clock pulse from the clock generator 34. The output terminal of the shift register $46i$ is connected to a corresponding latch input terminal $Ri$ and to an operation circuit of the next stage. Each of the other operation circuits includes, as shown in FIG. 4, an AND gate $40j$ connected to the output terminal of the gate circuit 22 and to a latch output terminal $Mj$ of the latch circuit 20; an exclusive-OR gate $42j$ for calculating the exclusive OR value of the output bits from the AND gate 40 and the input bits supplied to its data input terminal; and a shift register $44j$ for storing output bits from the exclusive-OR gate $42j$ in response to a clock pulse generated by the clock generator 34. The output terminal of the shift register $44j$ is connected to a corresponding latch input terminal $Rj$ and a operation circuit of the next stage.

The operation of the error correction circuit shown in FIGS. 1 to 4 will now be described.

Since, in this embodiment, a generator polynomial $G(x)=(x^{21}+1)(x^{11}+x^2+1)$ is adopted, a maximum of 42,987 bits of data can be transferred, 32 check bits are used, and a maximum of 11 bits of burst error data can be corrected.

A case will now be discussed where shortened 256 byte (2048 bits) Fire code data is transferred from the host processor 2 to the memory 4, or vice versa. Data of 40,939 bits (42,987−2,048) is unnecessary, and it would be a waste of time to transfer it upon error correction. In order to prevent this, the correction polynomial $M(x)$ must be calculated and stored in the latch circuit 20 in advance by a method to be described below. Firstly, the content of the presettable down-counter circuit 32 is set to 40,940 and an output signal "1" is generated by the presettable down-counter circuit 32. Then, the first operation mode setting signal is generated by the mode setting circuit 33 to set the error correction circuit 8 to the first operation mode. In this mode, the input selection circuit 24 receives the output signal generated by the presettable down-counter circuit 32, the gate circuit 22 is closed and the gate circuit 28 is opened. Secondly, clock pulses are generated by the clock generator 34 to reduce the count value of the presettable down-counter 32 one by one, and also shift registers of the operation circuits OP-0 to OP-31 are driven, thereby supplying the output data ($x^{40939}$) from the presettable down-counter circuit 32 to the cyclic shaft circuit formed of the operation circuits OP-0 to OP-31 and the gate circuit 28 through the input selection circuit 24. When the count value of the presettable down-counter circuit 32 has been reduced to zero, the presettable down-counter circuit 32 supplies a latch signal to the latch circuit 20 in order to latch data transferred from the operation circuits OP-0 to OP-31 to the respective input terminals R0 to R31 in the latch circuit 20. Thus, $x^{40939}$ is divided by the generator polynomial $G(x)$ and the remainder is stored as the correction polynomial $M(x)$ in the latch circuit 20.

When shortened Fire code data is transferred from the host processor 2 to the memory 4, the second operation mode setting signal is generated by the operation mode setting circuit 33, and the input selection circuit 24 receives the input data. The gate circuit 22 is closed and the gate circuit 28 is opened. The input data is also supplied to the buffer 26 and is stored therein. When the shortened input data is completely stored in the buffer 26, each bit of the check bit pattern, which is obtained as a remainder of the division of the input data by the generator polynomial $G(x)$, is stored in a corresponding one of the shift registers of the operation circuits OP-0 to OP-31. Then, the operation circuits OP-0 to OP-31 cease to be driven by the clock pulse, and the data is transferred from the buffer 26 to the memory 4. The gate circuit 28 is closed, the buffer 26 is set to stop generating output data and the gate circuit 30 is opened in response to the third operation mode setting signal from the mode setting circuit 33. Bits in the check bit pattern stored in the shift registers of the operation circuits OP-0 to OP-31 are serially shifted out and transferred to the memory 4. Thus, data formerly stored in the buffer 26 and the check bit pattern data are stored in the memory 4.

When the input data having check bit pattern data added thereto is read out from the memory 4 and transferred to the host processor 2, the fourth operation mode setting signal is generated by the mode setting circuit 33. The gate circuits 22 and 28 are opened and the input selection circuit 24 is set to receive input data from the memory 4 through the data selection circuit 12 (shown in FIG. 1). More specifically, 2080-bit input data is supplied to the buffer 26 bit by bit, and is supplied to the operation circuit OP-0 bit by bit and cyclically shifted within the cyclic shift circuit formed of the operation circuits OP-0 to OP-31 and the gate circuit 28. Simultaneously, each bit of the input data is, together with output bits representing the correction polynomial $M(x)$, supplied from the output terminals M0 to M31 of the latch circuit to AND gates of the operation circuits OP-0 to OP-31, respectively. Thus, the 2080-bit input data supplied through the gate circuit 22 is divided by the generator polynomial $G(x)$, and at the same time multiplied by the correction polynomial $M(x)$ in terms of the modulo 2. After the 2080th bit is supplied to the operation circuit OP-0, the product of the input data and the correction polynomial $M(x)$ is divided by the generator polynomial $G(x)$, and its remainder in the form of a bit pattern or a syndrome is stored in the shift registers of the operation circuits OP-0 to OP-31. If each bit of the shift registers is "0", it indicates that the data read out from the memory unit 4 contains no error, and the data stored in the buffer 6 is therefore transferred to the host processor 2 through the exclusive-OR gate 31 and the data selection circuit 14 shown in FIG. 1.

If at least one of bits in the shift registers of the operation circuits OP-0 to OP-31 is "1", that is, if after the 2080-bit input data is transferred to the buffer 26, an output signal "1" is generated from the OR gate 38 and a control signal is generated by the control signal generator 39, the fifth operation mode setting signal is generated by the mode setting circuit 33 to close the gate circuit 22 so that the input data ceases to be supplied thereto. Contents of the shift registers of the operation circuits OP-0 to OP-31 are cyclically shifted through the gate circuit 28 under this condition. The data stored in the buffer 26 is also supplied bit by bit to the exclusive-OR circuit 31. No control signal is generated by the control signal generator 37, nor is the gate circuit 30 opened, unless all the contents of the shift registers of the operation circuits OP-0 to OP-20 become "0". Therefore, the data from the buffer 26 is transferred to the host processor 2 through the exclusive-OR gate 31 and the data selection circuit 14 without alteration. When all the contents of each of the shift registers of the operation circuits OP-0 to OP-20 become "0", a signal of "1" level is generated by the NOR gate 36 and supplied from the control signal generator 37 to the gate circuits 28 and 30 in order to close the gate circuit 28 and open the gate circuit 30. Thus, the contents of each of the shift registers of the operation circuits OP-0 to OP-31 will be serially shifted. The control signal generator 37 is constructed to generate a control signal for a period corresponding to a read period required for reading out 11-bit data. After all of the bit data stored in the shift registers of the operation circuits OP-21 to OP-31 are supplied to the exclusive-OR circuit 31, the gate circuit 30 is closed. As described hereinbefore, if at least one bit "1" stored in the shift registers of the operation circuits OP-21 to OP-31 is shifted and supplied to the exclusive-OR circuit 31, the bit data from the buffer 26 to the exclusive-OR circuit 31 is transferred to the host processor 2 after being inverted in the exclusive-OR gate 31. After all the contents of the shift registers of the operation circuits OP-21 to OP-31 have been shifted and supplied to the exclusive-OR circuit 31, the bit data from the buffer 26 is stored again in the host processor 2 without alteration. The data from the buffer 26 is thus corrected based on data stored in each of the shift registers of the operation circuits OP-0 to OP-31, and is thereafter transferred to the host processor 2.

Although the invention has been described by means of a specific embodiment, it is not limited to the specific embodiment. For example, although $(x^{21}+1) \cdot (x^{11}+x^2+1)$ is adopted as a generator polynomial $G(x)$ in the above embodiment, other types of generator polynomials can also be used. It must be noted that, in this case, the number of the operation circuits to be used must be changed and the output terminal of the gate circuit 28 should be connected to the operational circuits selected in accordance with the selected generator polynomial $G(x)$ and constructed as shown in FIG. 3. Furthermore, for example, an up-counter, a latch circuit for storing predetermined count values, and a coincidence circuit for comparing output signals from the up-counter and a latch circuit and generating an output signal of "1" level only when they are the same, can be substituted for the presettable down-counter circuit 32 used in above embodiment.

What is claimed is:

1. A data error correction circuit comprising:
a data input terminal;
preset data input means;
input data selection means connected to said data input terminal and said preset data input means for selecting, in a first operating mode, preset data from said preset data input means to be transferred, and for selecting, in a second operating mode, input data having check bit data attached thereto supplied to said data input terminal to be transferred;
latch means for latching a correction polynomial M(x); and
error correction means for receiving, in the first operating mode, the preset data from said preset input means, for dividing the preset data by a generator polynomial G(x) in terms of the modulo 2, and for storing remainder bit data obtained in said latch circuit as the correction polynomial M(x); and for receiving, in a second operating mode, input data having check bit data attached thereto from said data input terminal, for multiplying the input data by the correction polynomial M(x), and for dividing the input by the generator polynomial G(x) in terms of the modulo 2 to obtain a syndrome, thereby detecting and correcting an error in the input data.

2. A data error correction circuit according to claim 1, wherein said preset data input means comprises a presettable down-counter circuit for generating an output signal of "1" level when data is preset, generating an output signal of "0" level after a counting operation is started, and supplying a latch signal to said latch means when a count value thereof becomes zero.

3. A data error correction circuit according to claim 2, wherein said latch means comprises n latch input terminals and n latch output terminals, and said error correction means comprises:
n series-connected operation circuits, an output terminal of each of which is connected to one of said n latch input terminals of said latch means and a first input terminal of each of which is connected to one of said n latch output terminals of said latch means;
a first gate circuit for connecting said data input terminal to a second input terminal of each of said n operation circuits;
a second gate circuit for connecting an output terminal of said operation circuit of the last stage to a third input terminal of one of said operation circuits which is selected by the generator polynomial G(x);
a data buffer circuit for storing the input data supplied to said data input terminal;
a third gate circuit connected to said operation circuit of the last storage; and
an exclusive-OR circuit, a first input terminal of which is connected to said data buffer circuit and a second input terminal of which is connected to said third gate circuit, each of said operation circuits connected to said second gate circuit comprising a first AND gate having said first and second input terminals as input terminals, a second exclusive-OR circuit for receiving an output signal from said first AND gate and an input signal, a third exclusive-OR circuit for receiving an output signal from said second exclusive-OR circuit and an output signal supplied to said third input terminal from said second gate circuit, and a shift register for shifting an output signal from said third exclusive-OR circuit; and each of the rest of said operation circuits comprising a second AND gate having said first and second input terminals as input terminals, a fourth exclusive-OR circuit for receiving an output signal from said second AND gate and an input signal, and a shift register for shifting an output signal from said fourth exclusive-OR circuit.

4. A data error correction circuit according to claim 3, wherein said error correction means receives the input data from said data input terminal in the third operating mode, divides the input data by said generator polynomial G(x) in terms of the modulo 2, adds a remainder bit pattern obtained by the division to the input data, and transfers the input data with the remainder bit pattern.

5. A data error correction circuit according to claim 1, wherein said error correction means receives the input data from said data input terminal in the third operating mode, divides the input data by said generator polynomial G(x) in terms of the modulo 2, adds a remainder bit pattern obtained by the division to the input data, and transfers the input data with the remainder bit pattern.

6. A data error correction circuit according to claim 1, wherein said latch means comprises n latch input terminals and n latch output terminals, and said error correction means comprises:
n series-connected operation circuits, an output terminal of each of which is connected to one of said n latch input terminals of said latch means and a first input terminal of each of which is connected to one of said n latch output terminals of said latch means;
a first gate circuit for connecting said data input terminal to a second input terminal of each of said n operation circuit;
a second gate circuit for connecting an output terminal of said operation circuit of the last stage to a third input terminal of one of said operation circuits which is selected by the generator polynomial G(x);
a data buffer circuit for storing the input data supplied to said data input terminal;
a third gate circuit connected to said operation circuit of the last storage; and
an exclusive-OR circuit, a first input terminal of which is connected to said data buffer circuit and a second input terminal of which is connected to said third gate circuit, each of said operation circuits connected to said second gate circuit comprising a first AND gate having said first and second input terminals as input terminals, a second exclusive-OR circuit for receiving an output signal from said first AND gate and an input signal, a third exclusive-OR circuit for receiving an output signal from said second exclusive-OR circuit and an output signal supplied to said third input terminal from said second gate circuit, and a shift register for shifting an output signal from said third exclusive-OR circuit; and each of the rest of said operation circuits comprising a second AND gate having said first and second input terminals as input terminals, a fourth exclusive-OR circuit for receiving an output signal from said second AND gate and an input signal, and a shift register for shifting an output signal from said fourth exclusive-OR circuit.

* * * * *